TRANSISTORIZED DETECTOR AND AUTOMATIC GAIN CONTROL CIRCUIT
Original Filed Feb. 8, 1957
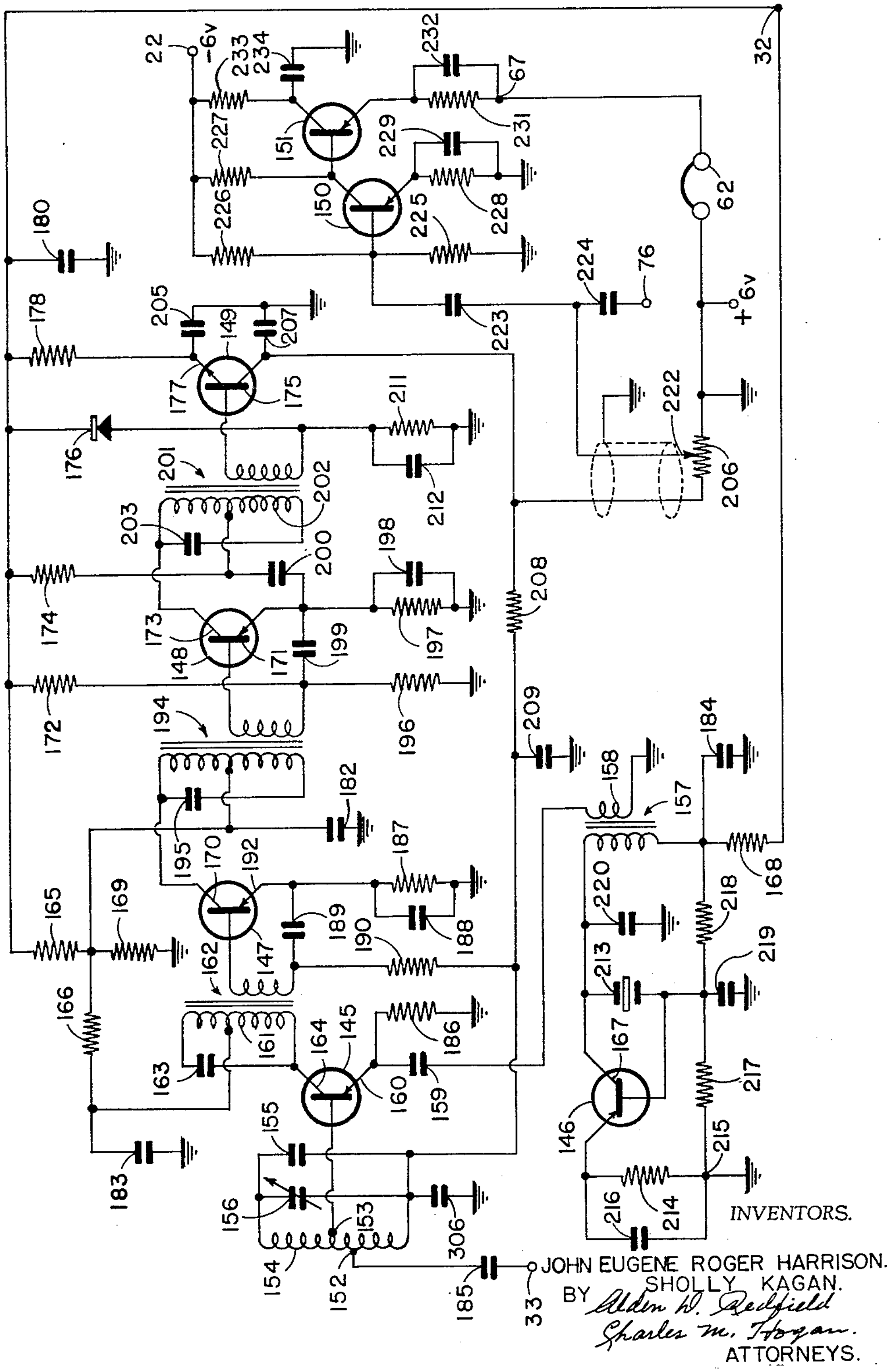
INVENTORS.
JOHN EUGENE ROGER HARRISON.
SHOLLY KAGAN.
BY Alden D. Redfield
Charles M. Hogan
ATTORNEYS.

United States Patent Office 3,005,093
Patented Oct. 17, 1961

3,005,093

TRANSISTORIZED DETECTOR AND AUTOMATIC GAIN CONTROL CIRCUIT

John Eugene Roger Harrison, Rochester, N.Y., and Sholly Kagan, Natick, Mass., assignors to Avco Manufacturing Corporation, Cincinnati, Ohio, a corporation of Delaware Continuation of abandoned application Ser. No. 746,902, July 7, 1958, which is a division of application Ser. No. 715,165, Feb. 5, 1958, now Patent No. 2,990,452, dated June 27, 1961, which is a division of application Ser. No. 639,075, Feb. 8, 1957, now Patent No. 2,935,606, dated May 3, 1960. This application Sept. 16, 1960, Ser. No. 56,554
1 Claim. (Cl. 250—20)

The present invention relates to transistor circuits and provides a temperature-stabilized detector and automatic gain control circuit of good performance and simple construction.

This application is a continuation of U.S. patent application Serial No. 746,902, filed July 7, 1958 (now abandoned), which was a division of application Serial No. 715,165, filed February 5, 1958, entitled "Compound-Connected Temperature-Stabilized Transistor Amplifier Circuit" (now U.S. Patent 2,990,452, issued June 27, 1961), which in turn was a division of our patent application Serial No. 639.075, filed February 8, 1957, entitled "Transistorized Portable Communication Set" (now U.S. Patent 2,935,606, issued May 3, 1960), all of which are assigned to the same assignee as the present application and invention. We claim the benefits of the original filing date of February 8, 1957.

The general objects of the invention are as stated in the aforementioned patents.

Specifically, one object of the present invention is to provide a particularly advantageous temperature-stabilized detector. Another principal specific object of the invention is to provide a particularly effective transistorized automatic gain control circuit.

For a better understanding of the present invention, together with other and further objects, advantages, and capabilities thereof, reference is made to the following description of the accompanying drawing, the single figure of which is a complete circuit schematic of a transistorized receiver including the present invention.

The circuits of the receiver comprise a mixer stage (transistor 145), a crystal-controlled oscillator (transistor 146), two intermediate frequency stages in cascade (transistors 147 and 148), a detector stage (transistor 149), and two audio stages (transistors 150 and 151).

The antenna is coupled to an inductor-tap 152 in the tuned input circuit of mixer transistor 145 by a capacitor 185. This transistor is of the surface-barrier type, and carrier signals are applied to the base from a tap 153 on a tuned circuit comprising a parallel combination of inductor 154, capacitor 155 and capacitor 156. The input and local oscillator signals are mixed in the emitter diode, the local oscillations being applied to the emitter circuit through a transformer 157, the secondary 158 of which is connected in series with a capacitor 159 between emitter 160 and ground. The collector is tuned to the difference frequency, resulting from the mixing, by the primary 161 of transformer 162, the primary being paralleled by a capacitor 163.

Negative biasing potential is supplied from the low voltage negative terminal 32 to these components: collector 164 of surface-barrier transistor 145, via series resistors 165 and 166, resistor 169 being connected in shunt between ground and the junction of resistors 165 and 166; collector 167 of surface-barrier transistor 146, via series resistor 168; collector 170 of surface-barrier transistor 147, via resistor 165; base 171 of transistor 148, via resistor 172; collector 173 of surface-barrier transistor 148, via resistor 174; base 175 of transistor 149, via diode impedance 176; and emitter 177 of detector transistor 149, via 178. It will be observed that, in the case of each surface-barrier transistor, the collector is reverse-biased—i.e., biased negatively. Suitable filter capacitors, connected in shunt to ground, are provided in this biasing network, as follows: capacitor 180, between low voltage terminal 32 and ground, capacitor 182, between ground and the junction of resistors 165 and 169; capacitor 183, between ground and that terminal of resistor 166 which is remote from terminal 32; and capacitor 184, between ground and that terminal of resistor 168 which is remote from terminal 32.

Continuing now with the description of the "front end" of the receiver, mixer transistor 145 is provided with a stabilizing resistor 186 between emitter and ground. Intermediate frequency signals are selected by the collector tank circuit of the mixer and applied, through transformer 162, to the input circuit or base of intermediate frequency transistor 147, which is connected in the common emitter configuration. A parallel combination of resistance 187 and capacitance 188 is inserted in the emitter lead of transistor 147. Resistance 187 stabilizes the circuit by compensating for temperature drift and variations among transistors. Capacitance 188 prevents degeneration and reduction in gain.

The series resistor 187 in the emitter leg counteracts a rise in collector current with temperature. Most of the collector current flows through resistor 187. The voltage drop across 187 tends to make the emitter 192 negative with respect to ground. The base is also negative with respect to ground, and the base-emitter voltage will be the difference between the AGC voltage applied from resistor 190 and the smaller voltage drop across resistance 187. Now, assuming a temperature-induced increment in collector current, the voltage drop across resistance 187 increases, making the emitter less positive relative to the base than it was before. This decrease in forward-biasing voltage of the base-emitter circuit results in less emitter current, thus causing a compensatory decrease in collector current. Resistor 186 performs a similar stabilizing function with transistor 145.

The first intermediate frequency stage is coupled to the second by a transformer 194, the primary of which is tuned by a capacitor 195 and the secondary of which has a lead connected to the base of transistor 148. This transistor is arranged in the common emitter configuration. The base is negatively biased relative to ground by connection in series with the junction of resistors 172 and 196 of a voltage divider. The emitter is less negatively biased relative to ground by resistor 197, by-passed by capacitor 198. This stage is stabilized by resistor 197. The second intermediate frequency stage is coupled to the detector by a transformer 201, the primary 202 of which is tuned by a capacitor 203 and the secondary of which has a lead connected to the base 175 of transistor 149.

The detector is connected in the common emitter configuration, with signals applied to the base and the emitter grounded for audio frequency currents by capacitor 205. The collector load circuit comprises resistor 206, paralleled by a capacitor 207, each of those elements having a terminal connected to ground.

The detector transistor 149 is biased slightly in the forward direction by the voltage at the base 175 derived through resistor 211 and controlled by diode 176. As A.C. signal is applied through transformer 201, it is rectified in the base-emitter junction, and the derived bias alternately adds to the fixed bias and increases the current flow through the emitter and thus through the collector. As the current flow through the collector increases, so does the voltage across resistor 206. This increased voltage is used to bias the mixer and first intermediate frequency transistors and produce an AGC (automatic gain control) action.

The audio component of the R.F. signal through transformer 201 is also impressed on transistor 149 through the base-emitter connection. The varying audio bias at the emitter-base junction causes varying current flow through the collector at an audio rate, and because of the transistor action amplification is obtained.

In this receiver the gain control is of the collector voltage control type. There is developed across resistor 206 the AGC voltage, applied, via resistors 208 and 190, to the base of first intermediate frequency amplifying transistor 147, and also applied, via resistor 208, to the base of mixer transistor 145. Filtering action is provided by shunt capacitor 209. As the received signal applied to the mixer input increases in amplitude, the AGC voltage becomes more negative, tending to increase the base and emitter current of transistors 145 and 147 with increasing input signal. This causes the voltage drop across the collector resistors 166, 169 and 169, respectively, to rise, reducing the collector voltage and gain of each stage.

In accordance with one feature of the invention, the detector transistor 149 is temperature-stabilized. For that purpose diode 176 is connected, in its low resistance or conductive direction, effectively between base 175 and the negative terminal 32 of the source of biasing voltage. The return path to ground for diode 176 is completed by resistor 211, by-passed by capacitor 212. The collector of the NPN transistor 149 is biased in the reverse direction by connection to ground, the positive terminal of the low voltage source, via resistor 206. The base is made negative relative to the collector, but less negative than the emitter by reason of the network 176, 211, and 212. The operation of this circuit is such that, when an ambient temperature change tends to increase or decrease collector current, for example, the non-linear resistance or diode 176 responds to the temperature change in a compensatory fashion, rendering the base more negative (less conductive) or less negative (more conductive), respectively, so as to maintain collector current constant. The diode resistance decreases as temperature increases.

Referring now to the local oscillator, it is a transistorized Pierce type, with a tuned circuit equivalent or crystal 213 connected between collector and base of transistor 146. The emitter is biased in a positive direction relative to the base by connection of the resistor 214 to ground at 215, ground being the positive terminal of the low voltage source. Between this point and the negative terminal 32 is a voltage divider comprising resistors 217 and 218 and 168. The base is connected to the junction of resistors 217 and 218, rendering it negative relative to the emitter, and the collector is connected, through the primary inductance of transformer 157, to the junction of resistors 218 and 168, rendering the collector negative relative to the base and therefore biasing the collector circuit in the reverse direction. This oscillator circuit supplies the local oscillations to the mixer stage of the receiver.

Coming now to the audio system, sliding contact 222 on resistor 206 functions as the adjustable element of a volume control potentiometer and is coupled by series capacitor 223 and shunt resistor 225 to the base of transistor 150 of the first audio stage.

The collector of PNP transistor 150 is biased negatively (in reverse direction) relative to the base, by connections of collector and base to negative source terminal 22, via resistor 227 and higher-value resistor 226, respectively. The base is connected to the junction of resistors 225 and 226. Inserted in the emitter leg is a stabilizing resistor 228, by-passed by capacitor 229. The emitter is less negative than the base, the drop across resistor 228 being less than the voltage applied to the base.

Transistor 150 is direct-coupled to transistor 151, the collector of the former being connected to the base of the latter. The collector of transistor 151 is grounded by capacitor 234, and that transistor is connected in the common collector configuration. The output load (earphone 62) is in series with stabilizing resistor 231. The latter is by-passed by capacitor 232. The collector of PNP transistor 151 is biased negatively relative to the base by connections of collector and base to negative source terminal 22, via resistor 233 and high-value resistor 227, respectively. Resistor 233 and capacitor 234 form a decoupling filter to prevent low frequency regeneration or "motor-boating."

This audio system amplifies a relatively small audio signal (.03 VRMS) to produce full output with little distortion and also will produce relatively the same output with a usable distortion level when a signal of .20 VRMS is applied to the input. It also has almost constant amplification from −55° C. to +55° C.

A side tone input terminal is shown at 76. It is capacitively coupled to the base of the first audio transistor 150 by capacitor 224, to the end that the audio stages and earphone 62 can be used to "monitor" a transmitter when the latter is in operation.

In the operation of the receiver incoming signals from the antenna are selectively applied to mixer transistor 145 and are there heterodyned against local oscillations produced by the crystal-controlled oscillator circuitry, so that amplified carrier signals of intermediate frequency are applied to the intermediate frequency amplifying system comprising the cascaded transistors 147 and 148. The modulation components are derived in the detector stage comprising transistor 149, and the audio signals are amplified in the two-stage audio amplifying network comprising transistors 150 and 151.

Thus there has been provided, in a radio receiver, the combination of a base-emitter fed mixer transistor 145 having an emitter 160, collector 164 and base, a plurality of intermediate frequency transistor stages 147 and 148 in cascade with said mixer transistor, a temperature-stabilized detector and AGC current generator comprising an input transformer 201 having a secondary with two terminals, a base-emitter fed detector transistor 149 having an emitter 177, collector and base 175, the detector base being connected to one of said terminals, a parallel resistance-capacitance network 211—212 being connected between the other secondary terminal and a point of reference potential, a source of bias current 32, a resistor 178 between the detector emitter 177 and said source, a diode 176 connected in a conductive direction in series between said source and said other secondary terminal to provide initial forward bias on the transistor base of polarity opposite to that resulting from detector collector current flow, a load resistor 206 between said detector collector and said point of reference potential, a resistive connection 208 between said detector collector and the base of said mixer transistor, and individual by-pass capacitors 205 and 207 between said point of reference potential and the emitter and collector of the detector transistor.

While there has been shown and described what is at present considered to be the preferred embodiment of the invention, it will be understood by those skilled in the art that various modifications and changes and substitutions of equivalents may be made therein within the true scope of the invention as defined by the appended claim.

What is claimed is:

In a radio receiver, the combination of a PNP type base-emitter fed mixer transistor having an emitter, collector and base; a plurality of intermediate frequency transistor stages in cascade with said mixer transistor, each stage comprising a PNP type transistor; a stabilized detector comprising an input transformer having a secondary with two terminals and a base-emitter fed NPN type detector transistor having an emitter, collector and base, the detector transistor base being connected to one of said terminals; a parallel resistance-capacitance network being connected between the other secondary terminal and a point of reference potential; a source of bias current having a positive terminal connected to said point of reference potential and also a negative terminal; an emitter load resistor between the detector emitter and the negative terminal of said source; a diode connected in a conductive direction in series between the negative terminal of said source and said other secondary terminal to provide initial forward bias on the detector transistor base of a polarity opposite to that resulting from detector collector current flow, the cathode of said diode being connected to said negative terminal; a first collector resistor between said detector collector and said point of reference potential; individual by-pass capacitors between said point of reference potential and the emitter and collector of said detector transistor; a resistive connection from the junction of said detector collector and the first collector resistor to the bases of said mixer transistor and the first one of said intermediate frequency stage transistors, whereby as the input signal amplitude is increased, the voltage applied to said bases becomes more negative to control and increase base current in said mixer and first intermediate frequency stage transistors; and second and third collector resistances connected between the collectors of said mixer and said first intermediate frequency stage transistors and said negative terminal, the first collector resistor being included in the base returns of both controlled transistors.

References Cited in the file of this patent

UNITED STATES PATENTS

| | | |
|---|---|---|
| 2,757,243 | Thomas | July 31, 1956 |
| 2,891,145 | Bradmiller | June 16, 1959 |
| 2,897,353 | Schweiss | July 28, 1959 |

FOREIGN PATENTS

| | | |
|---|---|---|
| N10959VIIIa/21a$^2$ | Germany | Aug. 23, 1956 |